United States Patent [19]

Wiech, Jr.

[11] Patent Number: 4,519,877
[45] Date of Patent: May 28, 1985

[54] FORMATION OF NARROW CONDUCTIVE PATHS ON A SUBSTRATE

[75] Inventor: Raymond E. Wiech, Jr., San Diego, Calif.

[73] Assignee: Fine Particle Technology Corporation, Camarillo, Calif.

[21] Appl. No.: 665,535

[22] Filed: Oct. 26, 1984

Related U.S. Application Data

[62] Division of Ser. No. 447,159, Dec. 6, 1982, Pat. No. 4,510,347.

[51] Int. Cl.³ .......................... C25D 5/02; C25D 5/48; C25D 5/50
[52] U.S. Cl. ........................................ 204/15; 204/26; 204/37.1
[58] Field of Search .................. 204/15, 11, 13, 28, 204/129.1, 129.6, 129.65, 35.1, 37.1, 26

[56] References Cited

U.S. PATENT DOCUMENTS

| 3,042,591 | 7/1962 | Cado | 204/15 |
| 3,239,441 | 3/1966 | Marosi | 204/15 |
| 3,438,127 | 4/1969 | Lehtonen | 264/220 |
| 3,560,357 | 2/1971 | Shaw | 204/129.65 |
| 3,560,358 | 2/1971 | Black | 204/129.65 |

Primary Examiner—Thomas Tufariello
Attorney, Agent, or Firm—Jay M. Cantor

[57] ABSTRACT

A method of forming electrically conductive paths within grooves formed in a substrate wherein the width of the grooves is of the same order of magnitude as the thickness of an electrically conductive layer deposited on the substrate and in the grooves. The substrate with grooves therein is exposed to a medium whereby electrically conductive material from the medium deposits substantially uniformly on all surfaces of the substrate which are exposed to the medium. In this way, the build-up of conductive material in grooves will take place along the side walls as well as the bottom of the grooves. If the layer is of substantially the same order of magnitude as the width of the groove (about one half the groove width or greater), the grooves will fill up with conductive material. The remainder of the substrate will ultimately provide a substantially flat conductive layer on the substrate surface. The conductive material is then removed by an action which removes exposed conductor along the entire substrate surface at a uniform rate whereby the conductor will be substantially entirely removed from the substrate except for the portion thereof within the grooves. In this way an electrically conductive path of predetermined geometry is provided.

20 Claims, 9 Drawing Figures 4,519,877

FORMATION OF NARROW CONDUCTIVE PATHS ON A SUBSTRATE

This application is a division of Ser. No. 447,159 filed Dec. 6, 1982 now U.S. Pat. No. 4,510,347.

BACKGROUND OF THE INVENTION

1. Field of the Invention

This invention relates to a method of forming electrically conductive paths in accordance with a predetermined geometry on surfaces of a substrate.

2. Description of the Prior Art

Substrates with electrically conductive patterns thereon and therein are well known in the prior art. Best known examples of this type are printed circuit boards with electrically conductive patterns formed on the surface thereof by standard techniques of either an additive process or a subtractive process of removing portions of an existing conductor, leaving the desired conductor pattern.

Another form of prior art substrate which combines the additive and subtractive techniques with conductive patterns thereon is shown by Lehtonen (U.S. Pat. No. 3,438,127) wherein a grooved substrate is formed by forming a mold having extensions therein which form grooves in the molded substrate which define an electrically conductive pattern. Electrically conductive material is then placed in the grooves on the substrate. Electroless plating and electroplating are stated to be preferred manners whereby conductive material is placed in the grooves.

The plating techniques described in the above noted patent require many processing steps which result in poor economy as well as the waste of production materials. For example, when the entire surface of the substrate is plated, the electrically conductive materials on the portions thereof other than the grooves must be removed by some type of abrading or other machining process. In this case, the deposited electrically conductive material will be lost. Other techniques require that the substrate be judiciously treated with wax or other anti-plating materials to control the situs of the plating operation. In this case, not only is the additional step of placing the wax or other appropriate material on the substrate required, but, in addition, the wax must later be removed and is not ordinarily economically subject to reuse. Furthermore, the above described techniques do not easily lend themselves to a continuous automatic type of production of substrates with electrically conductive paths thereon.

SUMMARY OF THE INVENTION

In accordance with the present invention, a substrate is provided having grooves therein which define the geometry of the electrically conductive path to be formed. The substrate is then treated in accordance with the prior art techniques such as described in Lehtonen (U.S. Pat. No. 3,438,127) to permit the substrate to receive electrically conductive material thereon. Electroplating will be described herein though any procedure whereby electrically conductive material is deposited on all exposed surfaces of the substrate substantially uniformly will work equally well such as, for example, electroless plating. The treated substrate is then placed into an electroplating bath in standard manner whereby the ion or ions in solution to be deposited are deposited onto the exposed surfaces of the substrate. This deposit is permitted to continue until the thickness of the layer deposited is about one half the width of the grooves in which deposition is to take place or thicker. Since deposition in the grooves takes place at almost three times the rate that it does on the other flat surfaces because there are three exposed surfaces in the groove, the grooves will fill up more rapidly than the surface of the substrate and ultimately the surface of the substrate will appear as almost a flat conductive region. At this point, the electrically conductive layer is removed from the substrate by a process which will uniformly remove the layer from the layer surface toward the substrate. In an electroplating environment, the substrate is exposed to a voltage of reverse polarity in a plating situation whereby the electrically conductive plated material will be removed from the surface of the substrate in a uniform manner until all of the conductive material has been removed from all surfaces except the grooves. A second method of removing the electrically conductive layer substantially uniformly from the layer surface toward the substrate is to treat the surface of the layer with an etchant which will dissolve the metal or metals or conductive material forming the layer. The end result is that a substrate has been provided with electrically conductive paths in all grooves and substantially no electrically conductive material on other portions of the substrate.

It can be seen that the above noted procedure can be used on a continuous basis for circuits of different patterns because substrates can be placed in a plating bath for a known time period, as determined experimentally to build up the desired electrically conductive layer thickness, removed therefrom and then placed into a deplating bath for a predetermined amount of time to remove all of the electrically conductive layer except the portion in the grooves, as determined experimentally, removed from the deplating bath and washed to provide the completed substrate with electrically conductive paths of predetermined geometry therefrom. Further processing on the substrate can then take place if desired.

The substrate is preferably formed of a ceramic material, either in the green or fired state, though it should be apparent that substrates of other materials will work equally well, such as substrates formed of plastic and the like. In the event the substrate is used in the green state, such substrate would be the type of green substrate described in Strivens (U.S. Pat. No. 2,939,199), Wiech (U.S. Pat. No. 4,197,118), Wiech (U.S. Pat. No. 4,305,756), or other methods of this type. Such "green" substrate with electrically conductive paths thereon can then be further processed, as, for example, by placing same in a mold and applying further material thereto in the manner described in U.S. Pat. No. 4,374,457.

The electrically conductive material deposited on the substrate, including the grooves therein, would be any electrically conductive material, elemental or alloy, that will adhere to the treated substrate. Such materials are generally well known in the art. A preferred such material would be a nickel-iron alloy containing fifty-eight percent iron and forty-two percent nickel. Such alloy is preferred because it has substantially the same coefficient of thermal expansion as aluminum oxide which is the preferred ceramic substrate material. Such an alloy would be deposited by providing a plating bath wherein the amount of iron to the amount of nickel would be in the ratio of fifty-eight to forty-two as is well known.

Other alloys can be deposited in the same manner by providing the proper metal ratios in the bath.

The cross-section of the grooves formed in the substrate can extend in different directions along the groove to provide a mechanical lock for the electrically conductive pattern formed in the grooves.

DESCRIPTION OF THE PREFERRED EMBODIMENT

Figure 1:
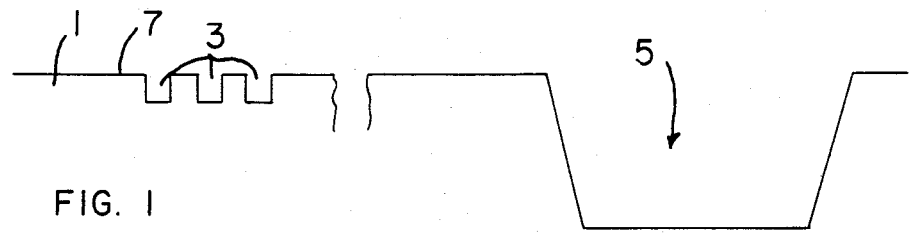
FIG. 1 is a schematic view of a portion of a substrate onto which the electrically conductive material will be deposited.

Referring first to FIG. 1, there is shown a portion of a substrate of the type described in U.S. Pat. No. 4,374,457. The substrate herein is preferably formed of a ceramic material, preferably aluminum oxide, though other ceramic substrate materials, such as beryllium oxide and the like can be used and other types of substrate materials, such as plastics and the like which are well known in the prior art can also be used. All such substrate materials are included as a part of this disclosure. The substrate is shown as 1 and includes an upper planar surface 7 in which are formed grooves 3 for receiving electrically conductive material and a well 5 for receiving semiconductor chips or the like. The geometry of the electrical conductor pattern to be formed is determined by the shape of the grooves 3 in the surface of the substrate. The invention herein relates in part to the method of forming the electrically conductive paths within the grooves 3.

Figure 2:
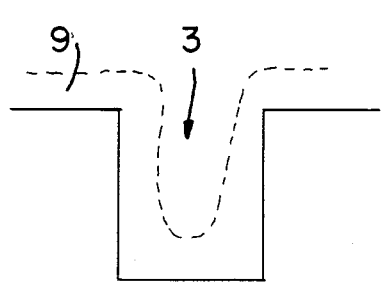
FIG. 2 is an enlarged view of one of the grooves 3 of FIG. 1 after a partial formation of a conductive layer therein.
Figure 3:
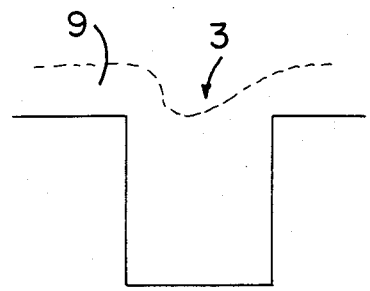
FIG. 3 is an enlarged view of the groove 3 of FIG. 1 when the conductive layer on the substrate has a thickness which is approximately one half or greater of the thickness or width of the groove 3.

Referring now to FIG. 2, there is shown an enlarged view of one of the grooves 3 of FIG. 1. Also shown is electrically conductive material 9 in the process of being formed on the surface of the substrate 1. The procedures to be utilized herein are such that the electrically conductive material 9 will be deposited substantially uniformly on all exposed surfaces of the substrate 1. Any procedure having this property can be utilized. This is standard procedure in electroplating techniques and other well known techniques. It can be seen from FIG. 2 that the build-up of electrically conductive material within the grooves 3 will be approximately three times as fast as build-up on the flat surfaces 7 (FIG. 1). The reason for this is that build-up takes place substantially uniformly on all exposed surfaces and there are three exposed surfaces within the grooves 3. Therefore build-up will take place in accordance with the conductive paths as shown in FIG. 2. It is therefore apparent that when the thickness of the layer 9 approaches approximately one third to one half the width of the groove 5, the entire groove 3 will be filled with conductive material and the top surface of the substrate 1 with conductive material 9 thereon will approach a planar condition, somewhat as shown in FIG. 3.

Figure 4:
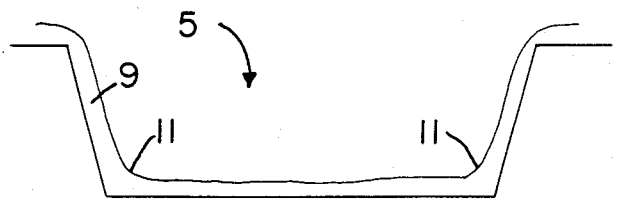
FIG. 4 is an enlarged view of the well 5 of FIG. 1 with electrically conductive material deposited thereon.
Figure 5:
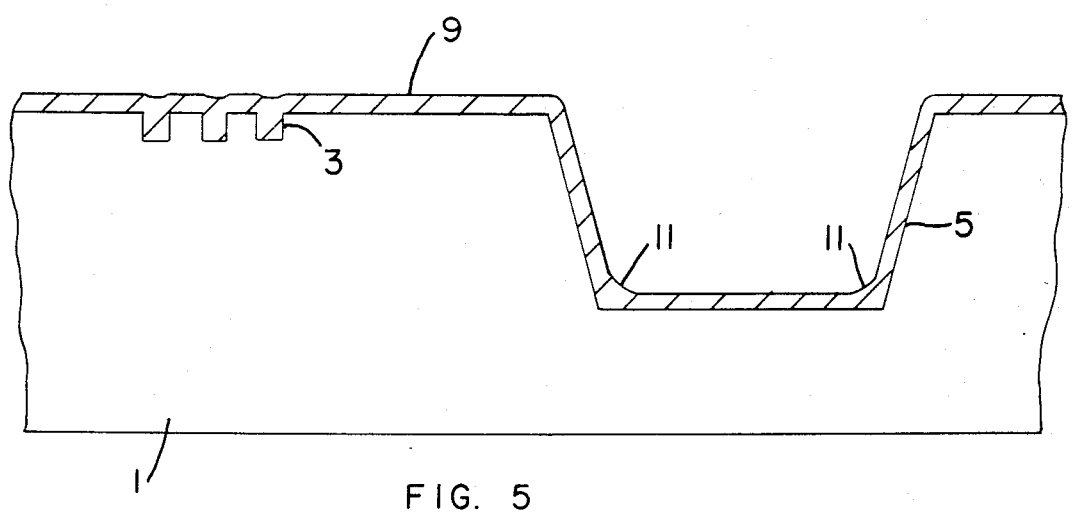
FIG. 5 is a cross-sectional view of the substrate of FIG. 1 after complete formation of electrically conductive material thereon.
Figure 6:
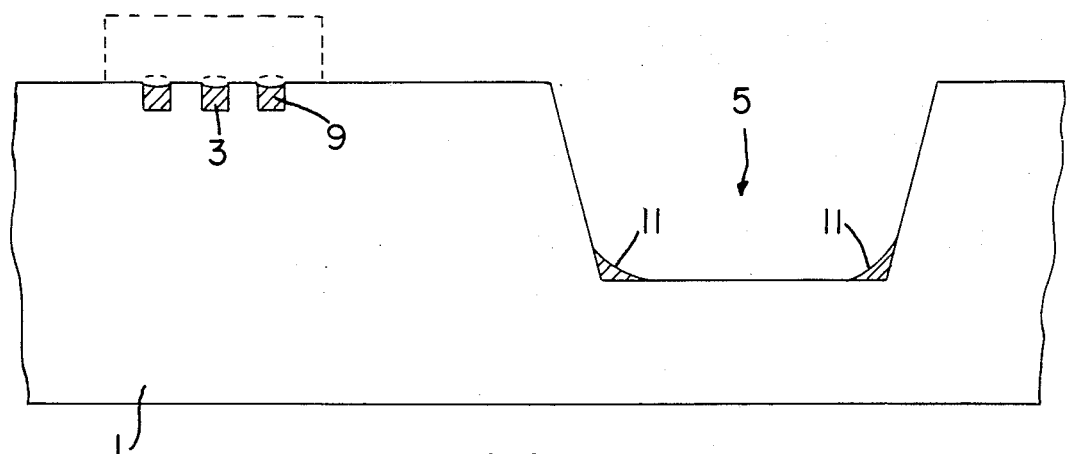
FIG. 6 is a view as in FIG. 5 after removal of electrically conductive material from all portions of the substrate except the groove 3.

On the other hand, in the case of the well 5, wherein the width of the well is far greater than the thickness of the layer 9 being deposited, there will be a uniform deposition on all walls of the well as shown in FIG. 4 with a possible slight rounding at the corners 11 as shown. The result of the build-up of the electrically conductive material 9 is shown in FIG. 5 wherein there is shown the substrate 1 with electrically conductive material thereon. The electrically conductive material 9 is then removed from all surfaces of the substrate at a uniform rate in a direction toward the substrate by standard methods such as, for example, in the case of electroplating, by reversing the polarity of the current source whereby the electrically conductive material is uniformly removed from the substate surface. Since the surface of the conductive layer 9 has become substantially planar as explained hereinabove and as shown in FIG. 5, substantially all of the electrically conductive material will eventually be removed from all flat portions 7 of the substrate 1 and at that point there will still be electrically conductive material in the grooves 3 and possibly in the corners of the well 5 as shown by conductive material 11 therein in FIG. 6.

The above is accomplished by providing the substrate as shown in FIG. 1 or in the above mentioned U.S. Pat. No. 4,374,457, treating the surface of the substrate in well known manner as described in the above mentioned U.S. Pat. No. 3,438,127 or by other well known methods so that the substrate will receive deposited material, such as electroplating material in this case, and then placing the substrate in a plating bath of the type described hereinabove for a sufficient period of time so that the build-up of plating material on the surface of the substrate is equal to at least about one third to one half the width of the grooves 3. At this point, the polarity in the electroplating bath is reversed and the conductive layer 9 is gradually removed until the electrically conductive layer 9 is no longer present on the flat surfaces 9 of the substrate 1 but conductive material remains in the grooves 3. The substrate is then removed from the plating bath and processed in accordance with the desired techniques.

An alternative processing technique is to deposit the electrically conductive layer by electroplating as described above to the desired thickness, removing the substrate with deposited electrically conductive material thereon from the electroplating bath and placing the substrate into a second bath wherein the polarity of electric current is reversed to remove the desired amount of electrically conductive material as described hereinabove. In either case, it can be seen that the processing is in a bulk mode and on a continuous basis.

An additional alternative processing technique is to employ an electrically conductive air drying ink of the type commonly used in the thick film silk screen printing of circuits. The molded substrate is thoroughly cleaned so that the suitably thinned ink will wet the substrate and groove structure as completely as possible, i.e., have the lowest possible contact angle with the substrate. The ink is applied to the substrate by a spraying or dipping so that a thin film of the ink covers the surface and fills the grooves. Again, the groove structure will be filled by the wetting phenomenon to achieve substantially the same result as shown in FIG. 5 that was by plating. The excess ink may be removed by dipping, spraying or vapor cleaning in solvent producing the structure of FIG. 6.

In the event that the grooves have substantial depth, it is apparent that current will have difficulty travelling to the lowermost portions of the grooves and further that the electroplating solution can easily become depleted in such regions. For this reason, it is desirable to agitate the bath in order to minimize bath depletion as described above and to provide maximum current flow to all surfaces of the substrate.

While the preferred embodiment has been described as depositing electrically conductive material on exterior surfaces of the substrate, it is apparent that such electrically conductive material will be deposited on any surfaces that can be reached by the plating bath and plating current. It is therefore apparent that grooves or holes extending to the interior of the substrate which also extend to a surface of the substrate and are capable of carrying plating solution and plating current into such interior regions, can have electrically conductive material deposited on the surfaces thereof. In this manner, the electrically conductive paths can be formed in the single process in the interior regions of the substrate as well.

Figure 7:
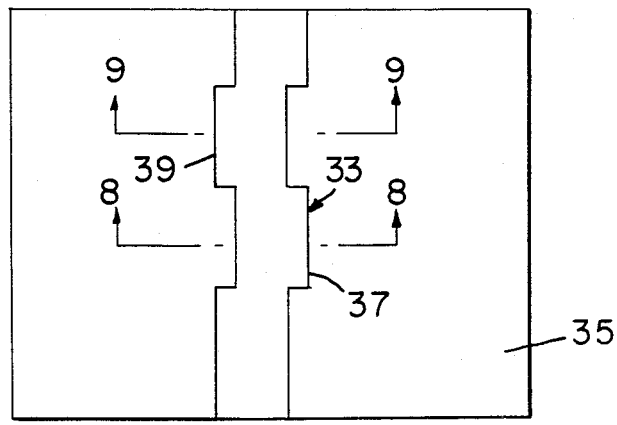
FIG. 7 is a top view of a portion of a substrate showing an electrically conductive pattern formed therein which extends in different directions along the groove.
Figure 8:
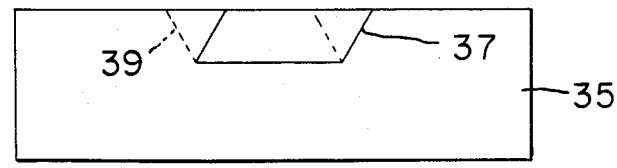
FIG. 8 is a view taken along the line 8—8 of FIG. 7.
Figure 9:
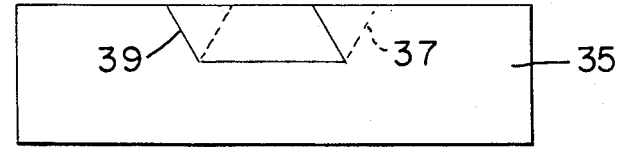
FIG. 9 is a view taken along the line 9—9 of FIG. 7.

The above described method of forming electrically conductive patterns in a substrate provides the ability to provide such patterns which are not only chemically secured to the substrate but also mechanically secured. This further minimizes the possibility that the pattern will pull away from the substrate. The mechanical securing is obtained by forming the grooves 3 of FIG. 1 in a manner such that the cross-section of the groove normal to the groove axis changes. With reference to FIGS. 7 to 9, FIG. 7 shows the groove 33 which appears in the form of steps from the top surface 35. The step 37 is shown in greater detail in FIG. 8 and is shown to have a cross-section in the shape of a parallelogram with side walls extending upwardly to the right. The step 39 is shown in greater detail in FIG. 9 and is shown to have a cross-section in the shape of a parallelogram with side walls extending upwardly to the left.

It is apparent that the continuous conductor formed in the groove 33 by the above described process will be locked in the groove because it cannot be pulled out of the groove due to the geometry thereof. It is also apparent that geometrical shapes other than a parallelogram can be used, as long as the geometry provides the locking action described above.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

What is claimed is:

1. A method of forming material paths in grooves of predetermined width formed in a substrate surface, comprising the steps of:
    (a) providing a substrate with a surface and grooves of predetermined width in said surface having exposed walls,
    (b) building up on all exposed surfaces of said substrate including the exposed walls of said grooves, substantially uniformly, in directions substantially normal to said exposed surfaces, a layer of predetermined deplatable material having a thickness at least about one third the width of said grooves to fill said grooves with said deplatable material and form deplatable material over said grooves extending above said surface, and
    (c) deplating said layer substantially uniformly in a direction normal to the exposed surface of said layer until substantially all of said layer is removed from said substrate surface whereby said layer is retained substantially only in said grooves.

2. The method of claim 1 wherein step (b) includes placing said substrate in an electroplating solution and electroplating said layer onto said substrate.

3. The method of claim 1 wherein said layer is formed of electrically conductive material.

4. The method of claim 2 wherein said layer is formed of electrically conductive material.

5. The method of claim 2 wherein step (c) includes reversing the direction of current flow in said electroplating solution.

6. The method of claim 4 wherein step (c) includes reversing the direction of current flow in said electroplating solution.

7. The method of claim 6 wherein said substrate is formed from aluminum oxide ceramic and said layer is an alloy of about 58% iron and 42% nickel.

8. The method of claim 1 wherein said substrate is a "green" ceramic material and, subsequent to step (c), removing binder from said substrate and sintering said substrate.

9. The method of claim 1 wherein said substrate is formed from aluminum oxide ceramic and said layer is an alloy of about 58% iron and 42% nickel.

10. The method of claim 2 wherein said substrate is formed from aluminum oxide ceramic and said layer is an alloy of about 58% iron and 42% nickel.

11. The method of claim 3 wherein said substrate is formed from aluminum oxide ceramic and said layer is an alloy of about 58% iron and 42% nickel.

12. The method of claim 4 wherein said substrate is formed from aluminum oxide ceramic and said layer is an alloy of about 58% iron and 42% nickel.

13. The method of claim 5 wherein said substrate is formed from aluminum oxide ceramic and said layer is an alloy of about 58% iron and 42% nickel.

14. The method of claim 2 wherein said substrate is a "green" ceramic material and, subsequent to step (c), removing binder from said substrate and sintering said substrate.

15. The method of claim 3 wherein said substrate is a "green" ceramic material and, subsequent to step (c), removing binder from said substrate and sintering said substrate.

16. The method of claim 4 wherein said substrate is a "green" ceramic material and, subsequent to step (c), removing binder from said substrate and sintering said substrate.

17. The method of claim 5 wherein said substrate is a "green" ceramic material and, subsequent to step (c), removing binder from said substrate and sintering said substrate.

18. The method of claim 6 wherein said substrate is a "green" ceramic material and, subsequent to step (c), removing binder from said substrate and sintering said substrate.

19. The method of claim 7 wherein said substrate is a "green" ceramic material and, subsequent to step (c), removing binder from said substrate and sintering said substrate.

20. The method of claim 13 wherein said substrate is a "green" ceramic material and, subsequent to step (c), removing binder from said substrate and sintering said substrate.

* * * * *